(12) United States Patent
Reid

(10) Patent No.: US 6,483,289 B2
(45) Date of Patent: Nov. 19, 2002

(54) MODULAR SENSOR ARRAY, METERING DEVICE AND MOUNTING AND CONNECTION BASE

(75) Inventor: Drew A. Reid, Brentwood, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/917,441

(22) Filed: Jul. 27, 2001

(65) Prior Publication Data

US 2001/0043062 A1 Nov. 22, 2001

Related U.S. Application Data

(62) Division of application No. 09/044,042, filed on Mar. 18, 1998, now Pat. No. 6,329,810.

(51) Int. Cl.[7] .............................................. G01R 19/00
(52) U.S. Cl. ...................................... 324/115; 324/149
(58) Field of Search ................................ 324/115, 156, 324/142, 424, 117 H, 118, 149

(56) References Cited

U.S. PATENT DOCUMENTS

| | | | |
|---|---|---|---|
| 3,826,951 A | 7/1974 | Mater et al. ................. | 361/100 |
| 3,924,160 A | 12/1975 | Maier et al. .................. | 361/94 |
| 4,870,532 A | 9/1989 | Beatty et al. ................. | 361/93 |
| 4,873,603 A | 10/1989 | Ishii ............................. | 361/96 |
| 5,162,725 A | * 11/1992 | Hodson et al. ............. | 324/115 |
| 5,317,250 A | * 5/1994 | Warmerdam ................ | 324/156 |
| 5,420,799 A | 5/1995 | Peterson et al. ............ | 364/483 |
| 5,834,932 A | * 11/1998 | May ............................ | 324/107 |
| 5,933,004 A | 8/1999 | Jackson et al. ............. | 324/142 |

* cited by examiner

Primary Examiner—N. Le
Assistant Examiner—Vincent Q. Nguyen
(74) Attorney, Agent, or Firm—Michael J. Femal; Larry I. Golden

(57) ABSTRACT

A metering module has a housing, a metering circuit in the housing for receiving and processing at least one signal corresponding to an electrical quantity, and developing an output signal. A connector mounted to the said housing is coupled to the metering circuit, and configured for engagement with a mating connector at least one of a sensor array module and a mounting and connection base. Mounting structure is provided on the housing for removably mounting the housing to at least one of a sensor array module and a mounting and connection base. A circuit in the housing delivers voltage and current signals received at the first and second connectors to a further connector mounted on the housing. First and second mounting structures are provided for mounting the housing to a surface and for mounting a removable metering module.

5 Claims, 6 Drawing Sheets

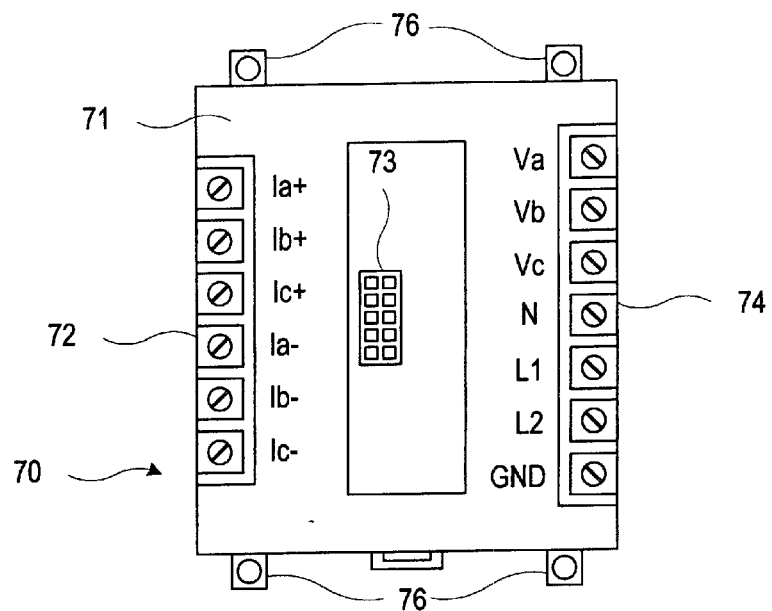
FIG. 9
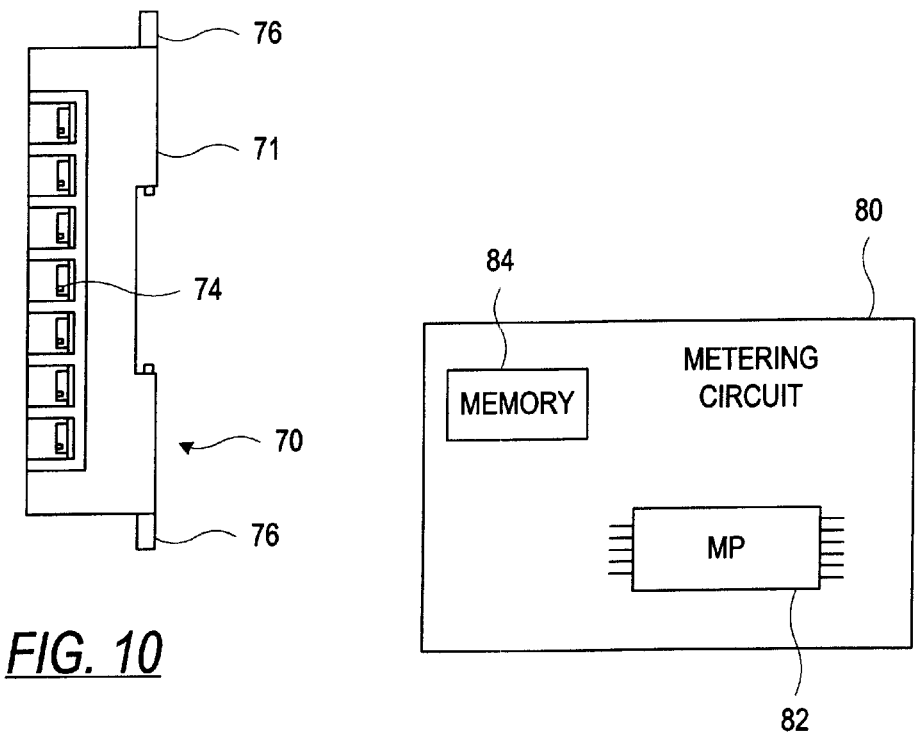
FIG. 10
FIG. 11

MODULAR SENSOR ARRAY, METERING DEVICE AND MOUNTING AND CONNECTION BASE

CROSS-REFERENCE TO RELATED APPLICATION

This application is being filed as a divisional application of pending U.S. patent application Ser. No. 09/044,042 U.S. Pat. No. 6,329,810, filed Mar. 18, 1998.

FIELD OF THE INVENTION

This invention is directed generally to equipment for monitoring electrical power transmission circuits and more particularly to a modular arrangement including one or more of a modular sensor array, a modular metering module and a modular connection base for use in such a monitoring system.

BACKGROUND OF THE INVENTION

The monitoring of currents and voltages as well as other conditions in electrical circuits generally requires the interaction and interconnection of a number of different components. One or more sensors such as current transformers and potential (voltage) transformers may be utilized and coupled at appropriate points in the electrical circuit to be monitored, so as to monitor the voltage and current values in the circuit as desired. Appropriate connections must then be made from these sensors into additional circuitry for further receiving and processing these voltage and current signals to determine whether the electrical characteristics of the monitored circuit fall within predetermined or desirable limits. This additional circuitry may provide additional output signals to trip circuit breakers or other components for interrupting the circuit, in the event the monitored electrical characteristics and conditions do not fall within the desired limits, or to produce other warnings, indications or readouts, as desired.

The additional circuitry may be part of a separate metering circuit which then must be suitably interfaced with the sensors and with the circuit breaker or other equipment and provided with suitable connectors, cabling, etc. to achieve the desired interconnections and functions. Alternatively, the various sensors and metering circuits may need to be coupled with various elements of different electrical systems such as panelboard, busway, or motor control centers. Each of these different requirements generally requires a different sort of custom installation with attendant connectors being provided to mate with the connectors of the panelboard, busway, motor control center or circuit breaker in which the sensor and associated processing or metering circuitry are to be utilized.

Accordingly, installation of appropriate monitoring elements and circuitry for different situations generally requires a relatively high level of skill on the part of the installer as well as access to a variety of different sensor elements, various metering devices and different types of connectors for completing the assembly and installation in each case. From the standpoint of a manufacturer or supplier, it is also necessary to design, manufacture and stock a wide variety of these components for use in different types of installations.

The present invention proposes to improve upon the foregoing situation by providing a number of novel modular components including a modular sensor array which may incorporate a number of prewired sensors. The sensor array may further be provided with an appropriate preconnectorized housing sized and configured to mate with the desired circuit breaker, panelboard, busway or motor control center with the appropriate mating connectors in place and appropriately located with respect to the housing. Furthermore, the sensor housing arranged to easily interfit with the conductors to be monitored as they enter the circuit breaker, panelboard, busway or motor control center, permitting the sensor array housing to be mounted directly to the same.

The invention further provides a modular metering module which is also provided with the necessary processing circuitry for performing all of the necessary processing functions for deriving various electrical characteristics of a circuit from voltage and current input signals. This metering module may be preconnectorized to readily receive input connections from appropriate sensors or from a sensor array and provide the appropriate output signals via others of the preconnectorized connections. Preferably the metering module is further arranged to conveniently mount directly to the sensor array which is in turn mounted to the circuit breaker, panelboard, etc. as previously noted. The sensor array module may include components for conditioning the current and voltage sensor signals prior to delivering the same to the metering module for further processing.

Alternatively, the metering module may mount to a mounting and connection base, which provides the appropriate interface and connections to the sensors and to the circuit breaker, panelboard, etc. Finally, the invention contemplates a novel mounting and connection base provided with a number of connectors for receiving output of individual sensors to be associated with the circuits to be monitored as well as providing for connection of a metering module for processing the sensor signals. The mounting and connection base and the metering module are preferably conveniently configured for simply and easily mounting the metering module to the mounting and connection base in a manner for simultaneously establishing both mechanical and electrical coupling of a metering module with the mounting and connection base. The mounting and connection base may further include additional electrical elements for conditioning the signals from current and voltage sensors prior to delivering the same to the metering module.

OBJECTS AND SUMMARY OF THE INVENTION

Accordingly, it is the general object of the invention to provide an improved modular system for monitoring electrical characteristics of an electrical circuit.

A more specific object is to provide a modular system in accordance with the foregoing object which includes a metering module and at least one of a mounting and connection base and a sensor array module.

In accordance with one aspect of the invention there is provided a modular sensor array comprising: a housing; at least one current sensor mounted to said housing and responsive to a current in an electrical conductor for developing a corresponding current signal; at least one voltage signal producing circuit mounted to said housing for developing a voltage signal corresponding to a voltage present on an electrical conductor; a connector mounted on said housing configured for engagement with a mating connector of an external measurement device; and circuit means for delivering the current and voltage signals to the connector.

In accordance with another aspect of the invention there is provided a metering module comprising: a housing; a metering circuit mounted in said housing for receiving at least one signal corresponding to an electrical quantity, for processing said signal and for developing an output signal;

a connector mounted to said housing and coupled to said metering circuit, and configured for engagement with a mating connector at least one of a sensor array module and a mounting and connection base; and mounting means on said housing for removably mounting said housing to at least one of a sensor array module and a mounting and connection base.

In accordance with yet another aspect of the invention there is provided a mounting and connection base for a measurement device comprising: a housing; first connection means on said housing for receiving a signal from a current sensor corresponding to a current in an electrical conductor; second connection means on said housing for receiving a signal from a voltage sensor corresponding to a voltage in an electrical conductor; circuit means in said housing for delivering voltage and current signals received at said first and second connectors to a further connector mounted on said housing; first mounting means for mounting the housing to a surface; and second mounting means on said housing for mounting a removable metering module.

BRIEF DESCRIPTION OF THE DRAWINGS

In the drawings:

FIG. 9 is a top plan view of the mounting and connection base;

FIG. 10 is a side elevation of the mounting and connection base;

FIG. 11 is a simplified schematic of a portion of a circuit of the metering module;

DETAILED DESCRIPTION OF THE ILLUSTRATED EMBODIMENT

Figure 3:
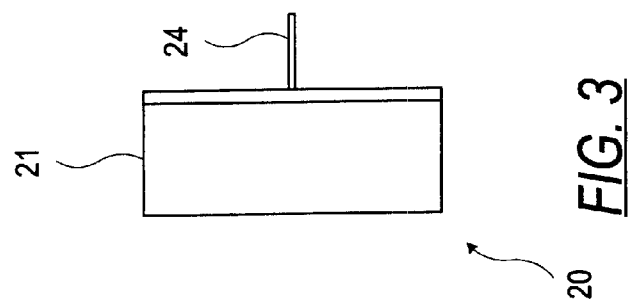
FIG. 3 is a side elevation of the sensor array.
Figure 2:
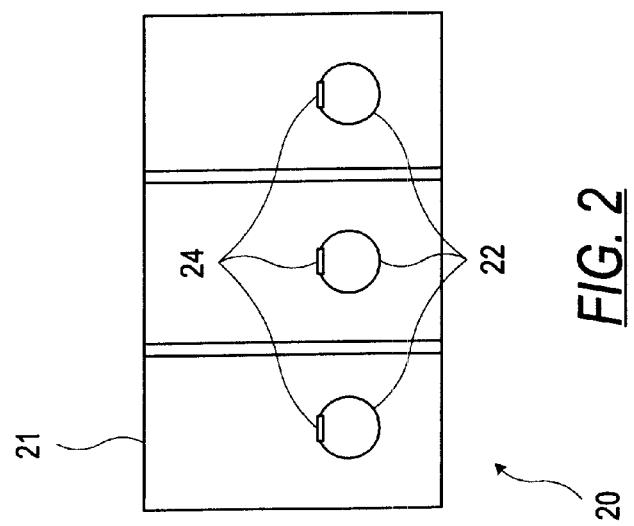
FIG. 2 is a back elevation of the sensor array of FIG. 1.
Figure 1:
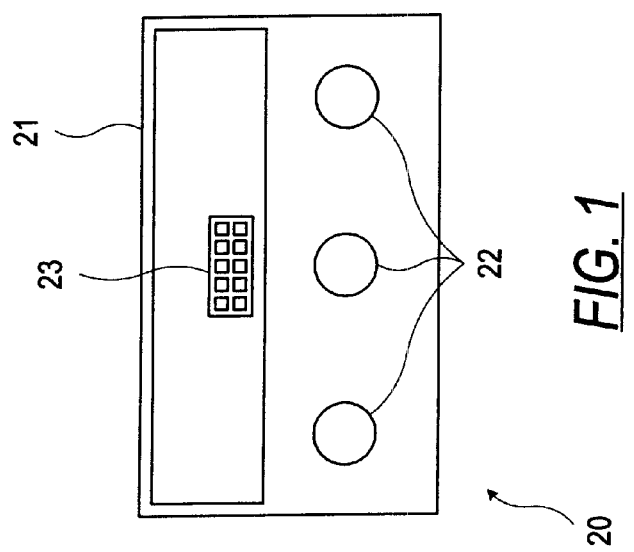
FIG. 1 is a front elevation of a sensor array in accordance with the invention.
Figure 4:
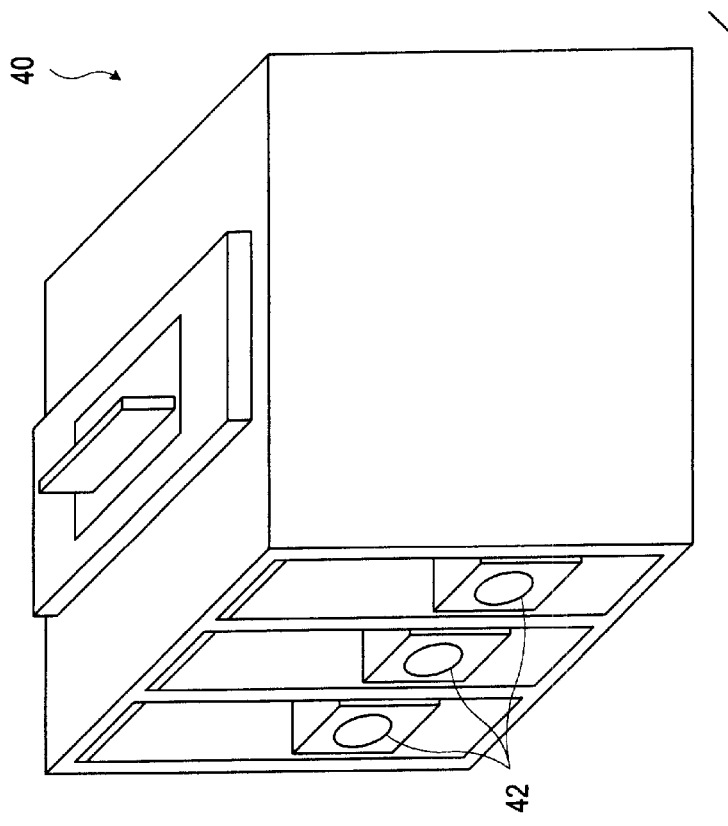
FIG. 4 is a perspective view illustrating the assembly of a sensor array and metering module in accordance with the invention with a circuit breaker.

Referring to the drawings, initially to FIGS. 1 through 4, there is shown one embodiment of a modular monitoring system in accordance with the invention. FIGS. 1 through 3 illustrate front, back and side elevations of a sensor array module 20. FIG. 4 illustrates the sensor array module 20 configured for mating engagement with a metering module or measurement device 30 on the one hand and a circuit breaker 40 on the other hand. The sensor array 20 may also be configured for cooperative engagement with devices or systems other than the circuit breaker 40, for example with a panelboard, busway or motor control center.

In the embodiment illustrated in FIGS. 1 through 4, the sensor array 20 has a housing 21 which is sized and configured to mount to a side surface of the circuit breaker 40 such that through openings 22 in the housing 21 align with similar openings 42 in the circuit breaker 40. In this manner, suitable voltage and/or current sensors, such as current transformers (shown in schematic form in FIG. 6) may be mounted adjacent the openings 22 in the housing 21 for sensing the voltage and/or current on various wires, such as a wire or cable 35, or cables as they pass through these openings and through the corresponding aligned openings 42 of the circuit breaker. Preferably, in the embodiment illustrated in FIG. 4, the sensor array housing 21 mounts flush against the facting surface of the circuit breaker 40. Additional alignment and positioning projections 24 may also be provided on the sensor array housing 21 to facilitate this mounting alignment.

The sensor array housing 21 also mounts a preconnectorized or integral prewired connector 23 which is configured for engagement for a mating connector 33 (FIG. 5) of the metering module 30. This connector is located in a mounting recess or area 27 which is configured for receiving the metering module 30, which has a complementary configured housing 31, for interfitting in the area or recess 27, and an integral prewired connector 33 configured for mating with the connector 23 of the sensor array 20. As best viewed in FIG. 4, a neutral conductor 25 may be provided projecting from the sensor array module housing 21 for connection to a neutral conductor of an electrical circuit to be monitored. Preferably, the projecting conductor 25 is detachable from the housing 21.

Figure 6:
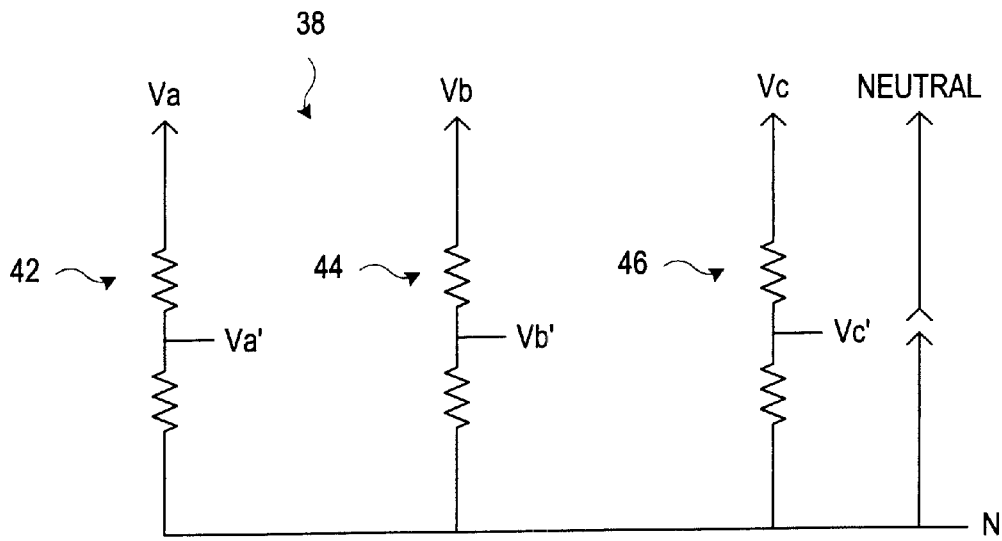
FIG. 6 is a schematic circuit diagram showing a part of a circuit portion of the sensor array module.
Figure 6:
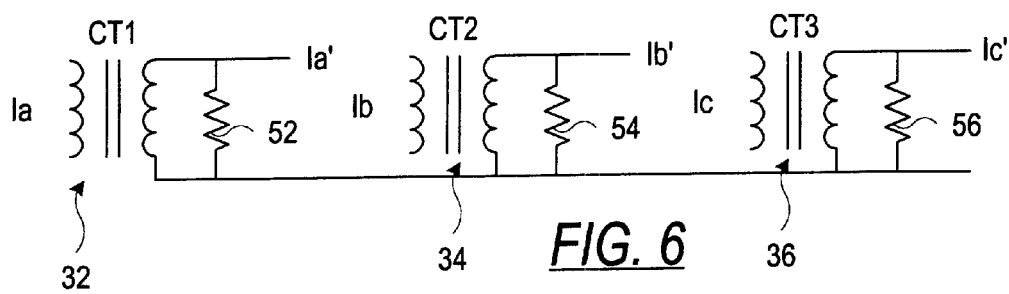
Figure 7:
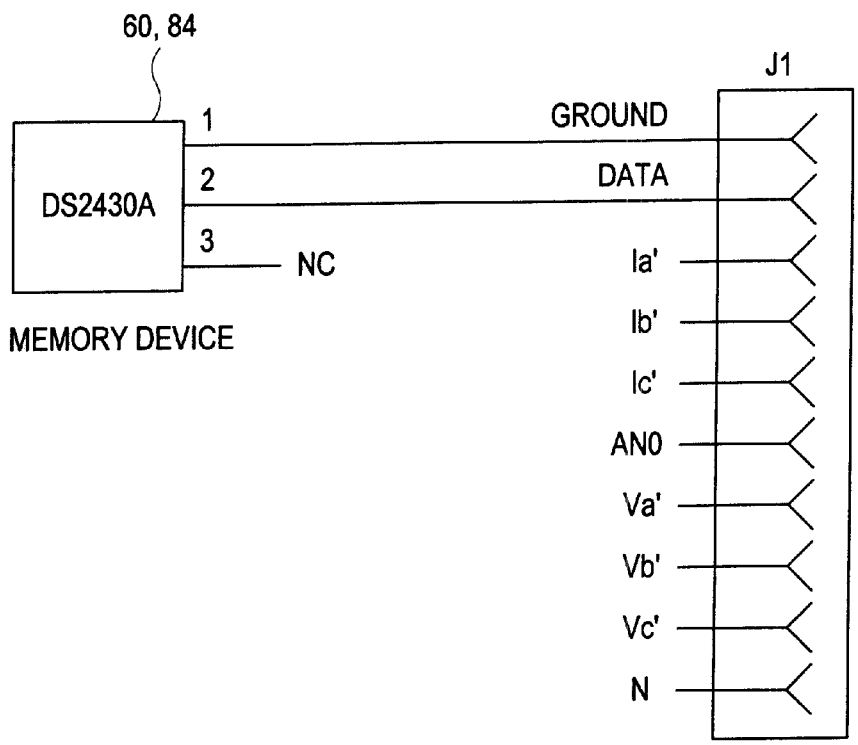
FIG. 7 illustrates schematically a further portion of a circuit and a connector which may be employed in the sensor module.

Referring also to FIGS. 6 and 7, the modular sensor array 20 also includes a number of circuit components or elements which are mounted in the housing 21, and which are here shown in schematic form. In this regard, at least one current sensor, and in the illustrated embodiment three current transformers 32, 34 and 36 are provided, each for responding to current in an electrical conductor and developing a corresponding output signal. These transformers may take the form of toroidal coils (see FIG. 14) which generally surround the through openings 22 of the sensor module 20 as shown in FIG. 4, to permit wires to pass therethrough as described above. Alternatively, the current sensors 32, 34 and 36 may comprise hall effect sensors not shown.

Figure 5:
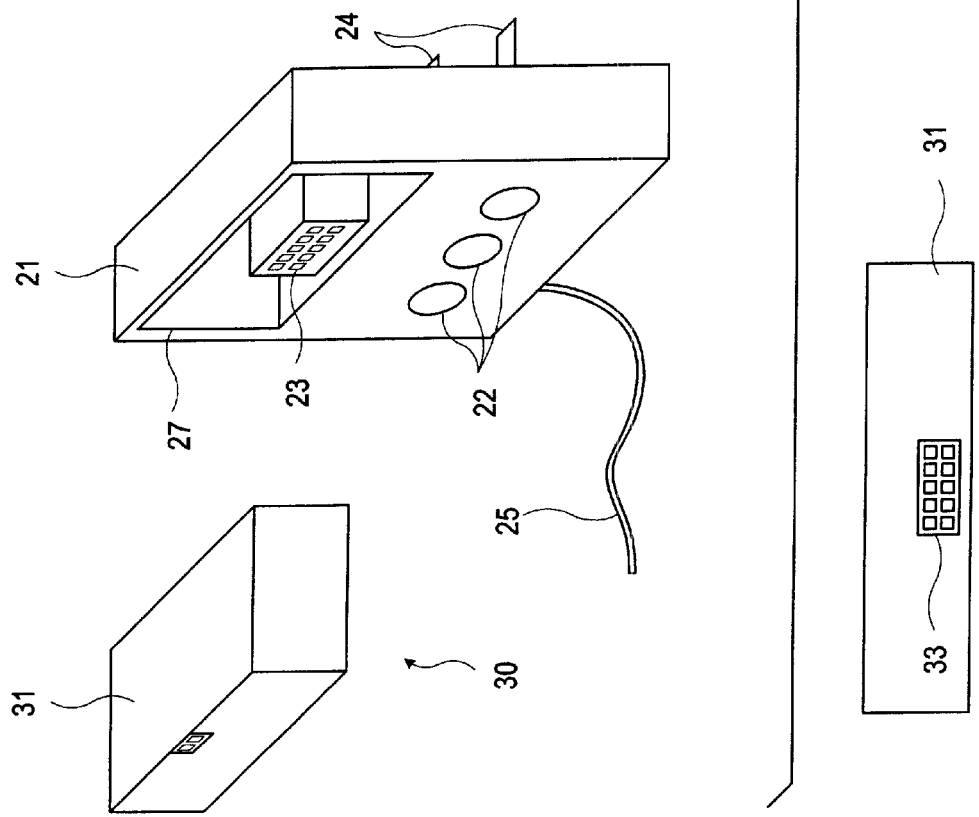
FIG. 5 is an end view of the metering module.

At least one voltage signal producing circuit 38 is also included in the circuitry of the modular sensor array 20 mounted within the housing 21. In the illustrated embodiment, the voltage signal producing circuit 21 produces a total of three different voltage signals (Va', Vb', Vc'), each of which corresponds to the voltage present (Va, Vb, Vc) on an electrical conductor or other electrical circuit portion being monitored. In the illustrated embodiment, the voltage signal producing circuit 38 also includes means for reducing the magnitude of the voltage signals, here shown as voltage divider circuits 42, 44 and 46 associated with each of the voltages being monitored. Thus, as shown in FIG. 5, respective voltages Va, Vb and Vc being monitored are reduced by the respective voltage dividers 42, 44 and 46 to provide respective corresponding output voltages Va', Vb' and Vc'.

Also, respective burden resistors 52, 54 and 56 are coupled across secondaries of the current transformers CT1, CT2 and CT3 so as to yield output currents Ia', Ib' and Ic'. In the illustrative embodiment, each of the voltage signals and current signals shown in FIG. 6 (Va', Vb', Vc' and Ia', Ib' and Ic') are sent to a corresponding connector element 23 of the modular sensor array 20, which is also schematically illustrated in FIG. 7. The connector 23 also includes associated neutral terminals, N, ANO for connection to the like designated circuit locations of FIG. 6.

As also shown in FIG. 7, the modular sensor array may further include a memory device 60 for storing data corresponding to predetermined electrical characteristics of the modular sensor array. For example, the memory device may include data corresponding to the number and types of sensors used, to their input/output characteristics, to the identity and output characteristics of the sensor and of the related circuit elements of FIG. 6 which are coupled to each of the terminals of the connector 23, and like information. The memory device 60 may comprise a non-volatile memory device, for example of the type designated DS2430A as shown in FIG. 7.

Figure 8:
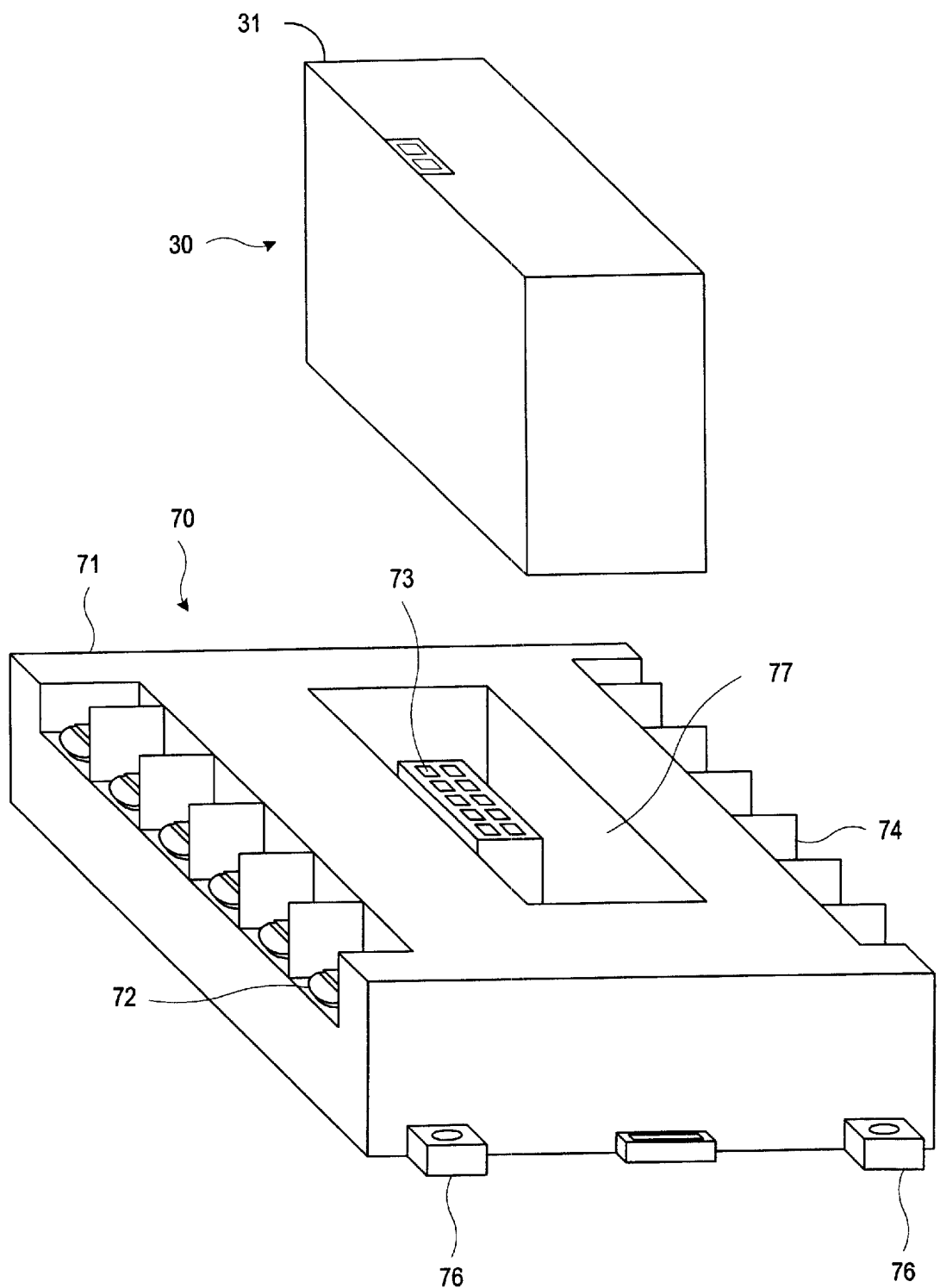
FIG. 8 is a perspective view illustrating a metering module and a mounting and connection base in accordance with the invention.

Referring now to FIG. 8, the metering module 30 is illustrated together with a cooperatively configured mounting and connection base 70. The metering module 30, as previously mentioned, has an integral prewired connector 33 mounted to its housing 31 (FIG. 5), which is configured for engagement with a mating connector such as the connector 23 of the sensor array or with a substantially identical connector 73 of the mounting and connection base 70. In this regard, the mounting and connection base 70 comprises a housing 71 which provided with a generally rectilinear recess 77 surrounding the connector 73 for cooperatively engaging and surrounding an end portion of the generally similarly shaped rectangular housing 31 of the metering module 30. This housing 31 of the metering module thus defines a mounting means for removably mounting the module 30 to the corresponding complimentary configured mounting means or recess 27 or 77, of the sensor array or of the mounting and connection base, as illustrated respectively in FIGS. 4 and 8.

Referring also to FIGS. 9 and 10, the mounting and connection base housing 71 also mounts first and second connection means or connector groups 72 and 74. Individual connectors of the respective connector groups 72 and 74 receive voltage and current signals which correspond to the voltages or currents being monitored in an electrical conductor, as indicated by the designations Ia, Ib, etc. and Va, Vb, etc. in FIG. 9. These generally correspond to the voltage and current inputs from various sensors, which are the same types of inputs as mentioned above with respect to FIG. 6. Preferably, further mounting means, such as illustrated mounting projections 76 are provided for mounting the housing 71 to a surface. The mounting means 76 may also be configured for use with an external DIN rail.

In the illustrative embodiment, and referring to FIG. 11, the metering module 30 also includes a metering circuit 80 which may include a microprocessor 82 for receiving signals either from the sensor array 30 or from the monitoring and connection base 70 which correspond to the electrical quantities being monitored, for processing these input signals and for developing an output signal. In one embodiment, the metering circuit 80 also produces a digital output signal. The metering circuit may also include a memory means or device 84 for storing a device address for identifying each sensor device which is coupled with the metering circuit 30 through its integral prewired connector 33. In this regard, the prewired connector 33 of the metering module 30 and its memory means or device 84 may be substantially identical to the connector 23 and memory device 60 schematically shown in FIG. 7, and hence additional reference numerals 33 and 84 are also utilized in FIG. 7 with reference to these components. In this regard, the metering circuit processor 82 may also include means for receiving and processing data corresponding to the electrical characteristics of a particular sensor array module with which it is associated. For example, such data in the memory device 60 of the associated sensor array module 20 may be transferred via the corresponding connectors 23, 33 to the corresponding memory device 84 of the metering module 30.

Figure 12:
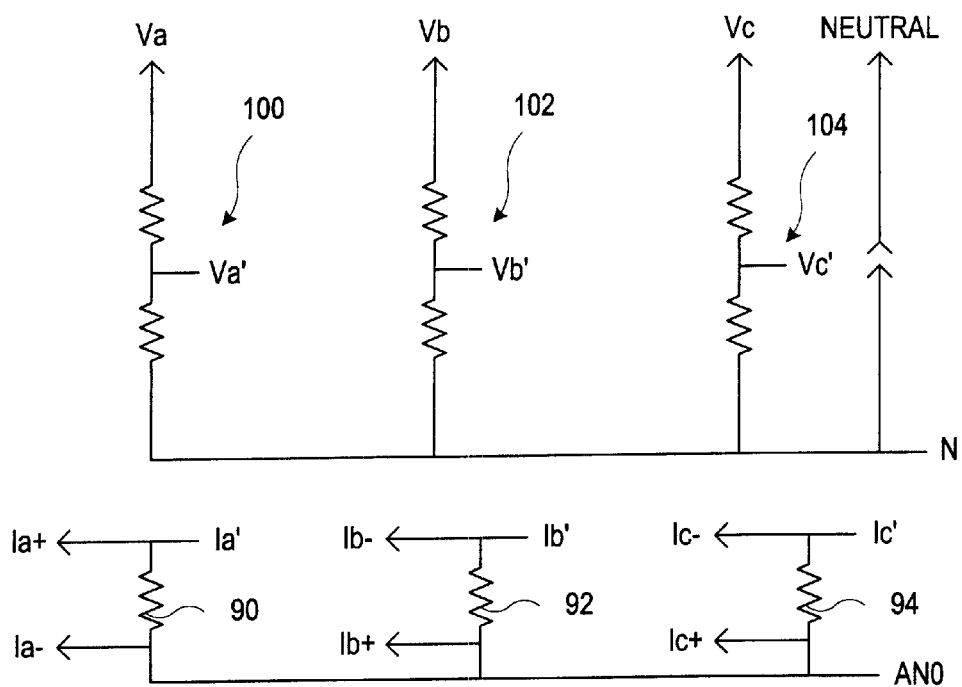
FIG. 12 is a circuit schematic showing circuitry which may be employed in the mounting and connection base.
Figure 13:
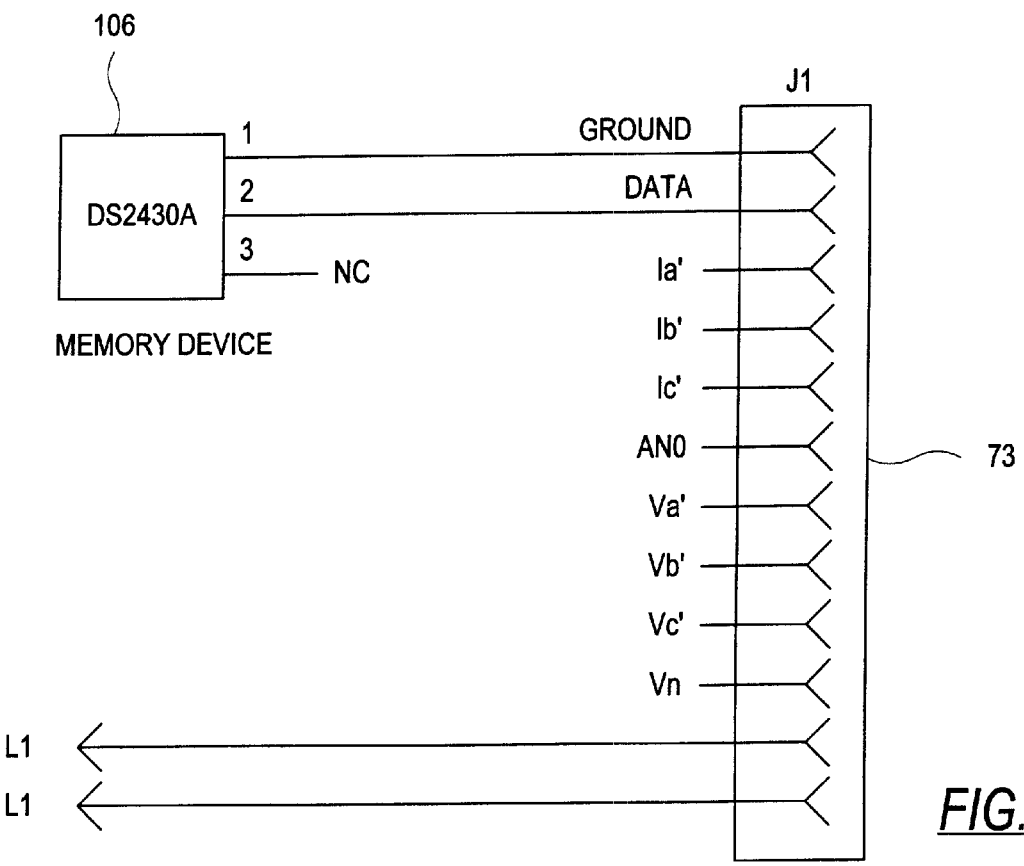
FIG. 13 shows schematically a further circuit element and a connector which may be employed in the mounting and connection.

Referring now to FIGS. 12 and 13, circuitry of the mounting and connection base is illustrated. It will be noted that this circuitry is similar in its structure and functions to the circuitry of the sensor array module described above in FIGS. 6 and 7. This is so that the metering module may utilize its same integral prewired connector with either the sensor array module or mounting and connection base in accordance with the invention.

Briefly, the circuit includes burden resistors 90, 92 and 94 as well as voltage reducing circuits in the form of voltage divider circuits 100, 102 and 104. The integral prewired connector 73 is schematically illustrated in FIG. 13. Internal circuitry of the metering module is such that all of the current signals and voltage signals form the respective circuits of FIG. 12 are delivered to the connector 73. Also, a memory device 106 is provided, and may comprise a non-volatile memory of the type DS2430A, the same type illustrated and described above with reference to the sensor array module of FIG. 7. This memory device 106 may store data such as information corresponding to the electrical characteristics of the circuits of FIG. 12.

While the invention may be susceptible to various modifications and alternative forms, specific embodiments have been shown and described herein above by way of example. It should be understood, however, that it is not intended to limit the invention to the particular forms disclosed. On the contrary, the intention is to cover all modifications, equivalents and alternatives falling within the spirit and scope of the invention as defined by the dependent claims.

What is claimed is:

1. A metering module comprising:

a housing;

a metering circuit mounted in said housing for receiving at least one signal corresponding to an electrical quantity, for processing said signal and for developing an output signal;

a connector mounted to said housing and coupled with said metering circuit, and configured for engagement with a mating connector of at least one of a sensor array module and mounting and connection base;

mounting means on said housing for removably mounting said housing to at least one of a sensor array module and a mounting and connection base; and wherein said metering circuit includes a microprocessor.

2. The electronic metering module of claim 1 wherein said metering circuit develops a digital output signal.

3. A metering module comprising:

a housing;

a metering circuit mounted in said housing for receiving at least one signal corresponding to an electrical quantity, for processing said signal and for developing an output signal;

a connector mounted to said housing and coupled with said metering circuit, and configured for engagement with a mating connector of at least one of a sensor array module and mounting and connection base; and further including memory means for storing a device address for identifying a sensor device within a sensor array module coupled with said metering circuit through said connector.

4. A metering module comprising:

a housing;

a metering circuit mounted in said housing for receiving at least one signal corresponding to an electrical quantity, for processing said signal and for developing an output signal;

a connector mounted to said housing and coupled with said metering circuit, and configured for engagement with a mating connector of at least one of a sensor array module and mounting and connection base; and wherein said metering circuit further includes means for receiving and processing data corresponding to electrical characteristics of a sensor array module.

5. A metering module comprising:

a housing;

a metering circuit mounted in said housing for receiving at least one signal corresponding to an electrical quantity, for processing said signal and for developing an output signal;

a connector mounted to said housing and coupled with said metering circuit, and configured for engagement with a mating connector of at least one of a sensor array module and mounting and connection base; and wherein said connector is an integral prewired connector.

* * * * *